(12) United States Patent
Yanagimoto et al.

(10) Patent No.: US 11,152,318 B2
(45) Date of Patent: Oct. 19, 2021

(54) SEMICONDUCTOR DEVICE AND MANUFACTURING METHOD OF SEMICONDUCTOR DEVICE

(71) Applicant: Mitsubishi Electric Corporation, Tokyo (JP)

(72) Inventors: Tatsunori Yanagimoto, Tokyo (JP); Kaori Sato, Tokyo (JP); Masao Kikuchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/649,539

(22) PCT Filed: Nov. 21, 2018

(86) PCT No.: PCT/JP2018/042953
§ 371 (c)(1),
(2) Date: Mar. 20, 2020

(87) PCT Pub. No.: WO2019/103028
PCT Pub. Date: May 31, 2019

(65) Prior Publication Data
US 2020/0258854 A1    Aug. 13, 2020

(30) Foreign Application Priority Data
Nov. 22, 2017    (JP) .............................. JP2017-224456

(51) Int. Cl.
*H01L 23/00*      (2006.01)
*H01L 29/16*      (2006.01)

(52) U.S. Cl.
CPC .............. *H01L 24/05* (2013.01); *H01L 24/03* (2013.01); *H01L 24/45* (2013.01); *H01L 24/48* (2013.01);
(Continued)

(58) Field of Classification Search
CPC ......... H01L 24/05; H01L 24/03; H01L 24/45; H01L 24/48; H01L 29/16; H01L 24/49; H01L 2224/73265
See application file for complete search history.

(56) References Cited

U.S. PATENT DOCUMENTS

| | | | |
|---|---|---|---|
| 2012/0126411 A1* | 5/2012 | Ohno | H01L 24/27 257/772 |
| 2012/0228776 A1* | 9/2012 | Ohno | H01L 24/33 257/773 |

(Continued)

FOREIGN PATENT DOCUMENTS

| | | |
|---|---|---|
| JP | 2007-019412 A | 1/2007 |
| JP | 2012-049469 A | 3/2012 |

(Continued)

OTHER PUBLICATIONS

International Search Report (PCT/ISA/210) dated Feb. 19, 2019, by the Japan Patent Office as the International Searching Authority for International Application No. PCT/JP2018/042953.

(Continued)

*Primary Examiner* — Douglas W Owens
(74) *Attorney, Agent, or Firm* — Buchanan Ingersoll & Rooney PC

(57) ABSTRACT

A semiconductor device of the present invention includes a first main electrode and a second main electrode respectively disposed on a first main surface and a second main surface of a semiconductor substrate, a protective film disposed on an edge part of the first main electrode; and a first metal film disposed in a region enclosed by the protective film on the first main electrode. The first metal film has a film thickness at a central portion larger than that at a part in contact with the protective film, and has irregularities on a surface thereof.

15 Claims, 13 Drawing Sheets

(52) U.S. Cl.
CPC .............. *H01L 29/16* (2013.01); *H01L 24/49* (2013.01); *H01L 2224/03442* (2013.01); *H01L 2224/04042* (2013.01); *H01L 2224/05124* (2013.01); *H01L 2224/05144* (2013.01); *H01L 2224/05147* (2013.01); *H01L 2224/05155* (2013.01); *H01L 2224/05647* (2013.01); *H01L 2224/48091* (2013.01); *H01L 2224/48137* (2013.01); *H01L 2224/48227* (2013.01); *H01L 2224/49175* (2013.01); *H01L 2924/10272* (2013.01); *H01L 2924/12032* (2013.01); *H01L 2924/13055* (2013.01); *H01L 2924/13091* (2013.01)

(56) References Cited

U.S. PATENT DOCUMENTS

| | | | | |
|---|---|---|---|---|
| 2014/0001620 | A1* | 1/2014 | Shimizu | H01L 23/49541 257/676 |
| 2015/0368779 | A1* | 12/2015 | Saito | C23C 24/04 427/455 |
| 2015/0380368 | A1* | 12/2015 | Momose | H01L 24/43 257/741 |
| 2016/0163812 | A1 | 6/2016 | Ushijima et al. | |
| 2018/0274104 | A1* | 9/2018 | Reznik | C23C 24/04 |
| 2019/0067225 | A1* | 2/2019 | Tonegawa | H01L 29/66727 |
| 2019/0371750 | A1* | 12/2019 | Beom | H01L 21/56 |

FOREIGN PATENT DOCUMENTS

| | | |
|---|---|---|
| JP | 2014-159611 A | 9/2014 |
| JP | 2016111227 A | 6/2016 |
| JP | 2017005100 A | 1/2017 |

OTHER PUBLICATIONS

Written Opinion (PCT/ISA/237) dated Feb. 19, 2019, by the Japan Patent Office as the International Searching Authority for International Application No. PCT/JP2018/042953.

* cited by examiner

F I G. 1
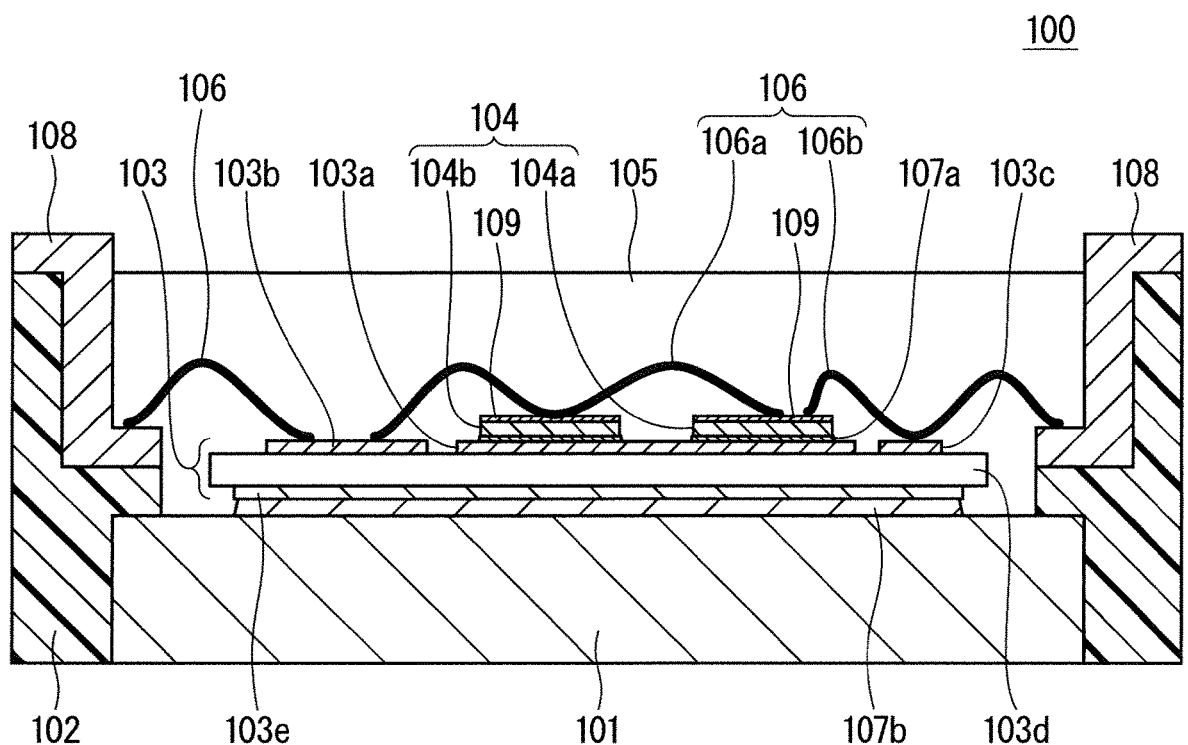

FIG. 8
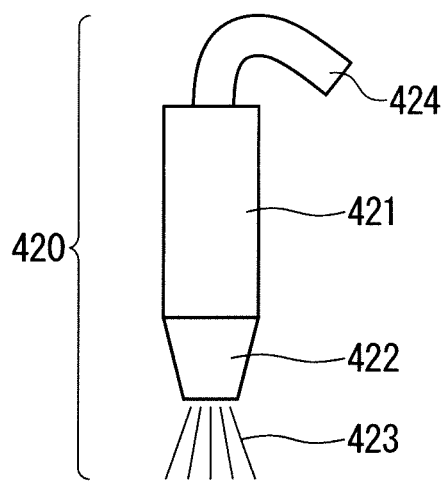
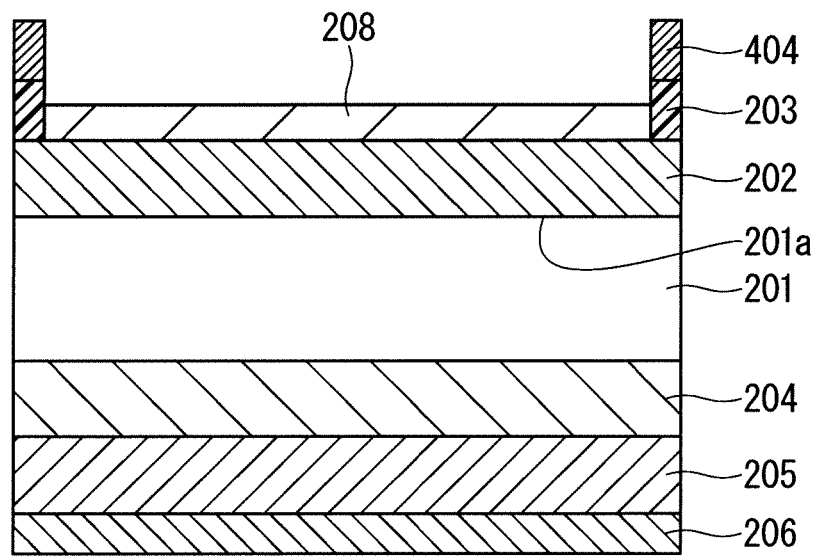

F I G. 1 4
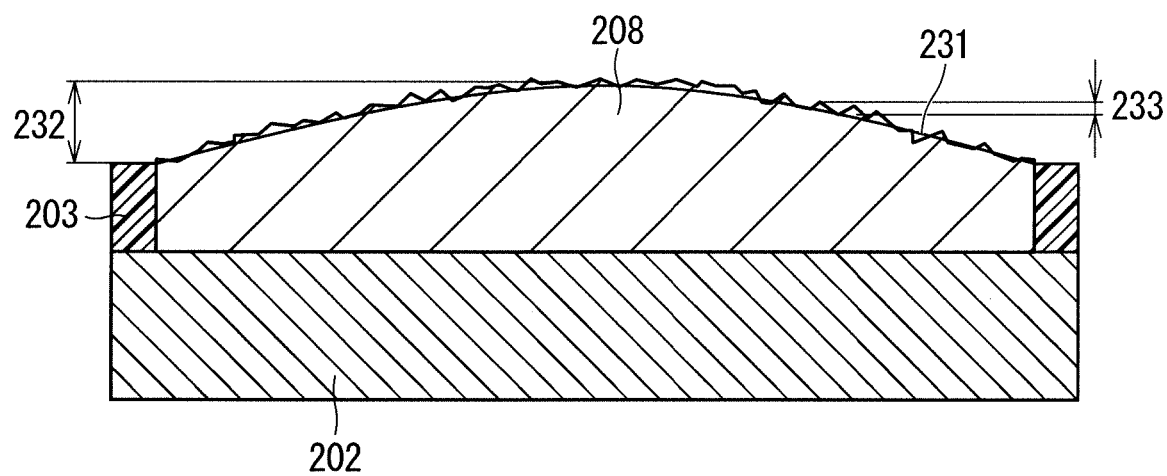

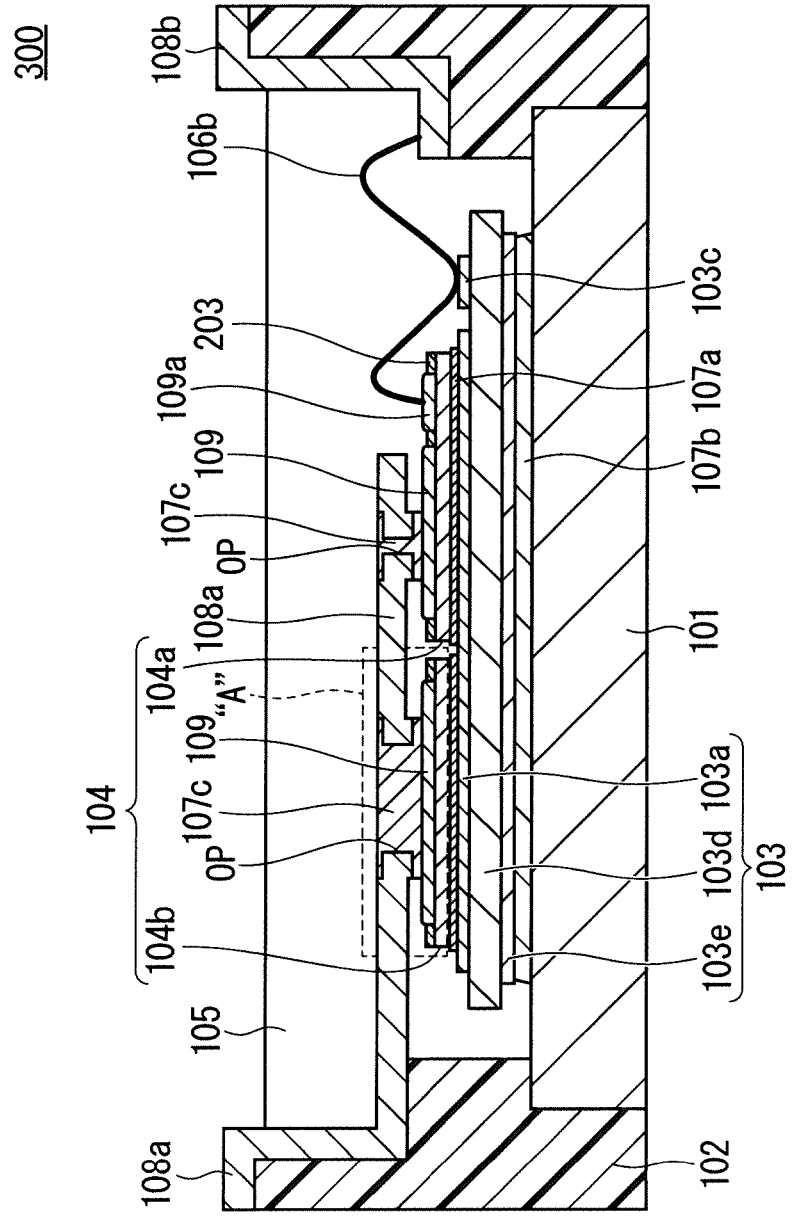

SEMICONDUCTOR DEVICE AND MANUFACTURING METHOD OF SEMICONDUCTOR DEVICE

TECHNICAL FIELD

The present invention relates to a semiconductor device, and more particularly to a semiconductor device such as an Insulated Gate Bipolar Transistor (IGBT) and a Metal Oxide Semiconductor Field Effect Transistor (MOSFET).

BACKGROUND ART

Many power semiconductor devices that constitute power converters such as inverters and converters have a configuration that includes switching devices such as IGBTs and MOSFETs, and freewheeling diodes connected in antiparallel to the switching devices. In general, an IGBT made of a silicon (Si) semiconductor is used as a switching device, and a pin diode is used as a freewheeling diode. In recent years, power semiconductor devices using silicon carbide (SiC), which is a wide band gap semiconductor having a wider band gap than Si semiconductors, have been developed. SiC has a high dielectric breakdown strength about 10 times that of Si, and the thickness of the drift layer can be reduced to about 1/10 that of Si, therefore, low on-voltage can be achieved and it is operable even at high temperatures. Accordingly, a power semiconductor device using SiC as a semiconductor material can be made smaller and more efficient than a conventional power semiconductor device using Si as a semiconductor material.

When mounting an obverse and reverse conductive semiconductor device in which main current flows in the thickness direction of the semiconductor device, for example, semiconductor devices for power conversion such as IGBTs, MOSFETs, and diodes on a ceramic substrate, the back electrode of the semiconductor device is soldered to the metal pattern on the ceramic substrate, and the surface electrode of the semiconductor device forms an energization path by connection by wire bonding and connection by soldering to a metal terminal. However, the cost of semiconductor devices in the semiconductor device module (hereinafter referred to as modules) is large. Therefore, in order to reduce the size and cost of the module, the current density supplied to each semiconductor device and the current density supplied to the wiring tend to increase. As the current density increases, the amount of heat generated from the semiconductor device during the operation of the semiconductor device increases more than that of conventional ones, and the semiconductor device temperature and the wiring temperature increase.

In a conventional wiring in which an aluminum (Al) wire is bonded to a surface electrode of an Al alloy, the life of the bonded portion may be reduced due to an increase in current density and temperature. Therefore, a module using a copper (Cu) wire having higher electrical conductivity than an Al wire and a module in which a Cu plate material is soldered to a surface electrode of a semiconductor device have been developed.

For the surface electrodes of the semiconductor devices of these modules, a Cu electrode is formed to enhance the bondability with the Cu wire, or an electrode with gold (Au) plating on the nickel (Ni) plating is formed to improve the adhesion of the solder.

For example, Patent Document 1 discloses a semiconductor device in which a metal film is formed on a front electrode and a back electrode of a semiconductor device using wet plating.

However, the film formation by wet plating has a slow film formation speed and a low film yield, so that the time and cost have increased. Thus, a film forming method using a cold spray method with a high film forming speed as disclosed in Patent Document 2 has drawn attention.

PRIOR ART DOCUMENTS

Patent Documents

[Patent Document 1] Japanese Patent Application Laid-Open No. 2007-19412

[Patent Document 2] Japanese Patent Application Laid-Open No. 2012-49469

SUMMARY

Problem to be Solved by the Invention

With the technique disclosed in Patent Document 2, the film is formed by performing cold spraying with a powder having a controlled particle diameter twice, resulting in low productivity and inefficiency; therefore, reduction in film formation time and film formation cost is not ensured. Further, in a semiconductor device manufactured by such a manufacturing method, the density of the film formed by the cold spray method is low, and a large number of defects are generated in the film. For this reason, there has been a problem in that when a Cu wire is to be bonded on this film by bonding, the film is deformed when a load is applied during bonding, and sufficient bondability cannot be obtained.

The present invention has been made to solve the above-described problem, and an object of the present invention is to provide a semiconductor device in which the bonding reliability of the wire bonding portion in the main electrode of the semiconductor device is improved.

Means to Solve the Problem

According to the present invention, a semiconductor device includes a first main electrode and a second main electrode respectively disposed on a first main surface and a second main surface of a semiconductor substrate, a protective film disposed on an edge part of the first main electrode, and a first metal film disposed in a region enclosed by the protective film on the first main electrode. The first metal film is a cold spray film having a film thickness at a central part larger than that at a part in contact with the protective film, and has irregularities on a surface thereof.

Effects of the Invention

According to the semiconductor device of the present invention, the first metal film has a difference between the thickness of the central part of the first metal film and the thickness of the portion in contact with the protective film, and the first metal film has irregularities on the surface. Accordingly, the convex portion is deformed first by the load when bonding the Cu wire is bonded to the first main electrode, for example, and the damage to the semiconductor device due to the bonding load is absorbed. Further, the Cu wire fits into the recesses, so that the surface area of the bonding increases, and the bonding quality of the bonding of the Cu wire is improved. The bonding reliability of the wire bonding portion is improved. Further, the first metal film has a thickness distribution and the surface with irregularities; therefore, the surface area of the first metal film is large, when the semiconductor device according to the present invention is incorporated in a module, the sealing resin hardly peels off.

BRIEF DESCRIPTION OF DRAWINGS

FIG. 1 A cross-sectional view illustrating a semiconductor device module on which a semiconductor device of Embodiment 1 according to the present invention is mounted.

FIG. 8 A cross-sectional view illustrating the manufacturing process of the semiconductor device of Embodiment 1 according to the present invention.

FIG. 14 A diagram schematically illustrating the surface state of a cold spray film.

FIG. 15 A cross-sectional view illustrating a semiconductor device module on which a semiconductor device of Embodiment 3 according to the present invention is mounted.

DESCRIPTION OF EMBODIMENTS

Embodiment 1

<Device Configuration>

Figure 2:
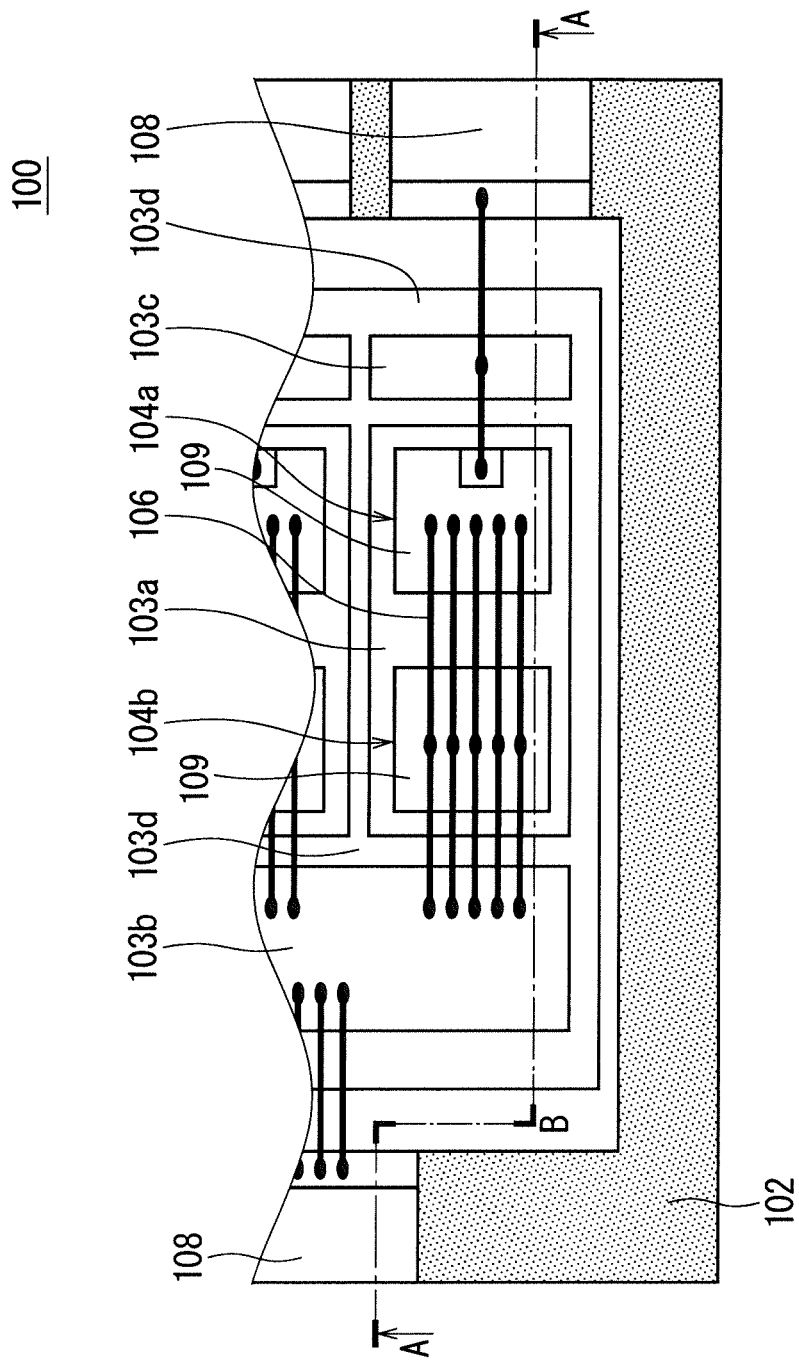
FIG. 2 A plan view illustrating the semiconductor device module on which the semiconductor device of Embodiment 1 according to the present invention is mounted.

FIG. 1 is a cross-sectional view illustrating a semiconductor device module (hereinafter referred to as module) 100 on which a semiconductor device of Embodiment 1 according to the present invention is mounted. FIG. 2 is a partial plan view of a module 100 as viewed from above, and a cover for closing an opening, a sealing resin, and the like, are omitted. Note that the cross section in the direction of the arrow along the line A-B-A in FIG. 2 is the cross section in FIG. 1.

As illustrated in FIG. 1, in a module 100, an insulating substrate 103 is bonded to the upper surface of a base plate 101 by solder (under-substrate solder) 107b, and the semiconductor device 104 including a switching device 104a and a freewheeling diode 104b is bonded to the upper surface of the insulating substrate 103 by solder (under-chip solder) 107a. The base plate 101 is housed in an opening on the bottom surface side of the case 102 having an opening on the upper surface side and the bottom surface side, and the base plate 101 having the same shape and the same area as the opening on the bottom surface side constitutes the bottom surface of the case 102.

In the base plate 101 housed in the case 102, the semiconductor device 104 and a plurality of terminals 108 installed in the case 102 are connected by wiring 106. The wiring 106 includes main wiring 106a and gate wiring 106b.

The base plate 101 is housed in the case 102, and the case 102 and the base plate 101 are bonded with a resin material or the like to form a bottomed and uncovered case 102. By introducing the sealing material 105 such as resin from the opening on the upper surface side of the case 102, the base plate 101, the insulating substrate 103, the semiconductor device 104, the wiring 106, and the terminals 108 are covered with the sealing material 105.

Here, as the base plate 101, an AlSiC plate and a Cu plate that are composite materials can be used. However, the base plate 101 may not be provided if it has sufficient insulation performance and strength, when the semiconductor device 104 is used, and the bottom surface of the case 102 may be constituted with the insulating substrate 103. That is, a lower conductor pattern 103e may be provided on the bottom surface of the insulating substrate 103, and the lower conductor pattern 103e may be exposed as the bottom surface of the case 102.

The case 102 is made of polyphenyl sulfide (PPS) resin, polybutylene terephthalate (PBT) resin, or polyethylene terephthalate (PET) resin.

The insulating substrate 103 is provided with upper conductor patterns 103a, 103b and 103c on the upper surface of the insulating material 103d, and with the lower conductor pattern 103e on the lower surface. The insulating material 103d may be composed of ceramic materials such as $Al_2O_3$, AlN and $Si_3N_4$, or organic insulating materials in which a filler material such as silica, alumina and boron nitride (BN) is mixed in a binder material such as an epoxy material or a liquid crystal polymer.

Further, although the upper conductor patterns 103a, 103b, 103c and the lower conductor pattern 103e may be made of a Cu material, the Cu material may be plated with Ni or silver (Ag). An Al material may be plated with Ni or Ag as another component.

The semiconductor device 104 uses a SiC-MOSFET as the switching device 104a and uses a SiC-Shottky Barrier Diode (SBD) as the freewheeling diode 104b. The Si-IGBT made from Si semiconductor may be used as the switching device 104a, and Si-Free Wheeling diode (FWD) may be used as the freewheeling diode 104b.

Although the switching device 104a and the freewheeling diode 104b are bonded to the upper conductor pattern 103a (electrically connected to the drain electrode) of the insulating substrate 103 by the under-chip solder 107a, which is a solder material based on tin (Sn), the upper conductor pattern 103a may be bonded with an Ag sintered material.

As the sealing material 105, although an epoxy material in which a filler is mixed is used, it is sufficient that the module 100 has sufficient insulation properties, and silicone gel may be used.

A cold spray film (not shown) formed by a cold spray method is formed on the outermost surface of the upper surface electrode 109 of the semiconductor device 104 (the switching device 104a and the freewheeling diode 104b). In Embodiment 1, a cold spray film of Cu powder is formed.

The main wiring 106a on the upper side of the semiconductor device 104 is a Cu wire. The upper surface electrode 109 of the switching device 104a, the upper surface electrode 109 of the freewheeling diode 104b, and the upper conductor pattern 103b that is electrically connected to the source electrode are bonded to each other by wedge bonding using a bonding wire. By using a bonding wire, the degree of freedom of connection is increased. The wiring material only needs to have conductivity, and for example, an Al wire may be adopted. Further, instead of a wire shape, a plate material (not shown) may be adopted, and the bonding is not necessarily wedge bonding, but the upper surface electrode 109 and the plate material of the semiconductor device 104 may be soldered, or bonded with an adhesive containing Ag, or an Ag sintered material.

By bonding the Cu wire on the cold spray film of Cu by wedge bonding, not only the bonding reliability of the bonded portion is greatly improved compared to the conventional bonding with an aluminum alloy electrode and an Al wire by wedge bonding, but also, when current flows in the same wire diameter, heat generation can be suppressed lower than that for Al wiring due to the electrical resistivity of Cu is $1.68 \times 10^{-8}$ Ωm, compared to $2.82 \times 10^{-8}$ Ωm for Al. The wire diameter of the Cu wire is, for example, about 150 μm to 600 μm.

A gate pad (not shown) is provided on the upper surface of the switching device 104a, the gate pad and the upper conductor pattern 103c (electrically connected to the gate electrode) are connected by the gate wiring 106b, and the upper conductor pattern 103c and the terminal 108 are connected by the gate wiring 106b. Although the gate wiring 106b is also a Cu wire, the greatly improved bonding reliability is ensured as compared with the conventional Al wire. Cu is superior to Al in strength; therefore, with Cu, deformation of the wire during assembly is less likely to occur, and the flowing current is less than that of the main wiring 106a; therefore, it may be thinner than the wire of the main wiring 106a. In this case, the wire diameter is, for example, about 50 μm to 200 μm.

For the same reason, the wiring connected to a cathode electrode and an anode electrode of the temperature detection diode (not shown) provided in the module 100 is also thinner than the wire of the main wiring 106a, as is the same with the gate wiring 106b.

Figure 3:
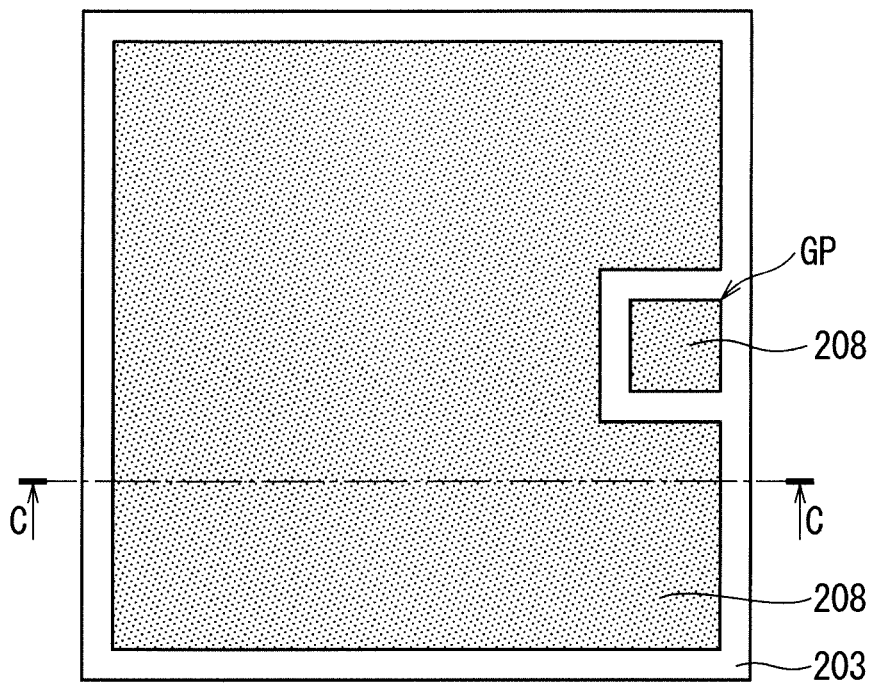
FIG. 3 A plan view illustrating the semiconductor device of Embodiment 1 according to the present invention.
Figure 4:
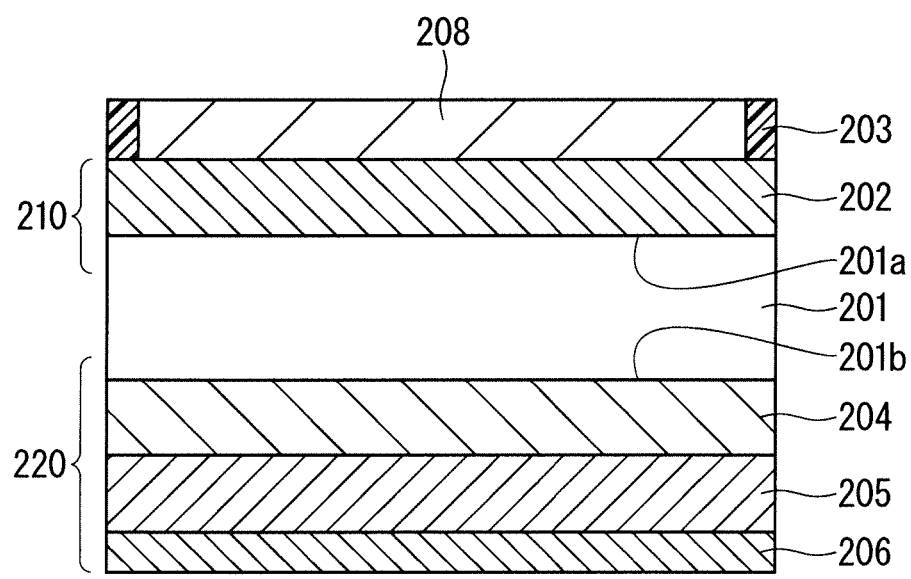
FIG. 4 A cross-sectional view illustrating the semiconductor device of Embodiment 1 according to the present invention.

FIG. 3 is a plan view of the switching device 104a as viewed from the upper surface side, and FIG. 4 is a cross-sectional view taken along the line C-C in FIG. 3.

As illustrated in FIG. 4, the switching device 104a includes a semiconductor substrate 201, an Al alloy electrode 202 provided on a first main surface 201a of the semiconductor substrate 201, a cold spray film 208 (first cold spray film) provided on the Al alloy electrode 202, a barrier metal 204 provided on a second main surface 201b of the semiconductor substrate 201, an Ni electrode 205 provided on the barrier metal 204, and an Au electrode 206 provided on the Ni electrode 205. Note that the cold spray film 208 may be referred to as first metal film.

The semiconductor substrate 201 is a SiC substrate or a Si substrate, and a diffusion layer (not shown) is provided in the surface thereof, and serves as an active layer that controls the operation of the MOSFET or IGBT.

A protective film 203 is provided on the Al alloy electrode 202 so as to enclose the cold spray film 208. As illustrated in FIG. 3, the protective film 203 is also provided so as to enclose the cold spray film 208 provided on the gate pad GP.

The Al alloy electrode 202 constitutes the first main electrode 210 together with the diffusion layer in the surface of the semiconductor substrate 201 (not shown), the barrier metal 204, the Ni electrode 205, and the Au electrode 206 constitute a second main electrode 220 together with a diffusion layer in the surface of the semiconductor substrate 201 (not shown).

The Al alloy electrode 202 is an electrode that conducts electrical continuity with the diffusion layer in the surface of the semiconductor substrate 201. Generally, pure Al, AlSi alloy, AlCu alloy, and AlSiCu alloy are used for the Al alloy electrode 202, and the mixing ratio of Si and Cu in the alloy is 5 wt % or less in terms of the weight ratio in the alloy.

The barrier metal 204 is a film that prevents the entry of elements that hinder external device operation and is generally a metal film of titanium (Ti), molybdenum (Mo), tungsten (W), vanadium (V), chromium (Cr) and Al, or the oxide or nitride of the above are used.

The Ni electrode 205 is directly bonded to the barrier metal 204 and reacts with the solder during soldering to form an alloy layer and an intermetallic compound. The Au electrode 206 is provided to avoid the influence of contact resistance when measuring the characteristics of the semiconductor device, and further to prevent Ni oxidation and improve solder adhesion.

The protective film 203 is provided in order to physically protect the surface of the semiconductor device and increase the insulation distance. Although polyimide which is an organic material is used for the protective film 203, $SiO_2$ or SiN which is an inorganic material may be used.

The cold spray film 208 is formed on the Al alloy electrode 202. The thermal energy and kinetic energy of the metal powder discharged from the cold spray equipment collide with the Al alloy electrode 202 which is the surface to be bonded. The frictional heat (energy) generated by this collision causes deformation on the respective outermost surfaces of the metal powder and the Al alloy electrode 202, and they are entangled with each other. The cold spray film 208 is formed by removing the respective outermost metal oxide films, continuously discharging metal powder from the cold spray equipment on a film formed by the reaction occurring at the interface between the metal powder and the Al alloy electrode 202, and continuously colliding with the previously formed cold spray film, and the film thickness is increased, thereby the cold spray film 208 is finally obtained.

Note that, the particle diameter of the metal powder supplied to the cold spray equipment is controlled as follows. That is, the particle is the particle that passed the test sieve of Japanese Industrial Standards (JIS) that have a mesh opening diameter of 100 μm (149 meshes), the production method thereof is electrolytic method and is Cu powder, its shape is close to a dendrite shape. In addition, as the manufacturing method of particle, the high-pressure swirl water atomization method may be employed, and in that case, a shape will become a shape close to a spherical shape. Moreover, the water atomization method may be employed for the production method of particle. Regardless of either having a shape close to the dendrite shape or the spherical shape, the Cu powder has a thin flattened shape that has no trace of its original shape due to the collision with the surface to be bonded.

Particles that have passed through a sieve having a mesh opening diameter of 100 μm have a particle size distribution with a particle that is 100 μm or less in diameter. Measurement by analyzing diffraction scattering pattern by laser diffraction method is performed, it is desirable that the particle diameter that maximizes the frequency (number) is about 20 μm in the particle size distribution measurement results where the horizontal axis is the particle diameter and the vertical axis is the frequency (number). That is, the particles desirably have a distribution in which particles with a particle that is about 20 μm in diameter form a distribution peak, and there are particles with smaller and larger particle diameter centering on the particle that forms the peak. As will be described later, from the viewpoint of obtaining a cold spray film having a fine particle interval, it is more desirable that the number of particles having a particle that is 20 μm or less in diameter is as large as possible, and it is desirable to control the production conditions of the particles so as to obtain metal powder having such a distribution. The particles forming the peak are not limited to a particle of 20 μm in diameter, but include a particle diameter in the range of about plus or minus 10% for a particle of 20 μm in diameter.

Such a particle size distribution allows the cold spray film 208 to have a film structure in which the powder particle interval is denser toward the Al alloy electrode 202 side, the powder particle interval becomes coarser as the distance from the Al alloy electrode 202 increases, and the powder particle interval becomes denser again as it approaches the outermost surface. This will be further described later.

The mesh opening diameter of the sieve may be less than 100 μm. For example, when a sieve having a mesh opening diameter of 53 μm (270 meshes) is used, particles having 53 μm or less in diameter are obtained, however, the yield is low. In order to form a cold spray film at a lower cost, a sieve having a mesh opening diameter of about 100 μm is desirable.

Therefore, when forming a cold spray film, for example, using metal powder having a particle of 100 μm or less in diameter is preferable, and more preferably, metal powder having a particle of 60 μm or less in diameter is used. The reason for this is that particles having a large particle diameter, for example, particles larger than 60 μm, cannot obtain sufficient kinetic energy to form a cold spray film when discharged from a nozzle of the cold spray equipment described later. Even if the particles collide with the previously formed cold spray film, the particles do not bond each other and are repelled outside the film by the flow of the discharge gas, therefore, they do not contribute to the film formation. For this reason, in order to form a uniform film, the particle diameter is preferably 60 μm or less. The lower limit particle diameter is desirably larger than 1.0 μm, for example, however, it is not necessary to sieve out the particles to control the lower limit particle size. Further, for the reasons to be described below, the particle diameter of the metal powder does not need to be uniform, and no need to sieve out the particle to make it uniform.

The metal powder subjected to sieving with a sieve having a predetermined mesh opening diameter has a particle size distribution that is the mesh opening diameter or less. When a film is formed by cold spraying using such metal powder, a collision is preferentially started from finer particles having a light weight to the Al alloy electrode 202 to form a cold spray film. Thereafter, the particles that are heavier and having a larger diameter collide with the previously formed cold spray film. Accordingly, the semiconductor device protected by the Al alloy electrode 202 is hardly destroyed. Furthermore, the finer particles collide with the Al alloy electrode 202 to form the cold spray film. Therefore, the closer the surface to be bonded, that is, the surface side of the Al alloy electrode 202, is a denser cold spray film composed of particles having a smaller particle diameter. On this dense cold spray film, metal powder collides in sequence with the particle size distribution that is the above-mentioned mesh opening diameter or less, so that a cold spray film with different film quality from a film with the finest coarsest powder particle interval to a film with the coarsest powder particle interval is formed. In addition, since particles having a smaller particle diameter collide between particles having a larger particle diameter, and a film having a relatively dense powder particle interval is formed. Therefore, the upper layer of the cold spray film becomes also relatively dense. As a result, the cold spray film 208 has a film structure in which the powder particle interval is denser toward the Al alloy electrode 202 side, the powder particle interval becomes coarser as the distance from the Al alloy electrode 202 increases, and the powder particle interval becomes denser again as it approaches the outermost surface.

Figure 18:
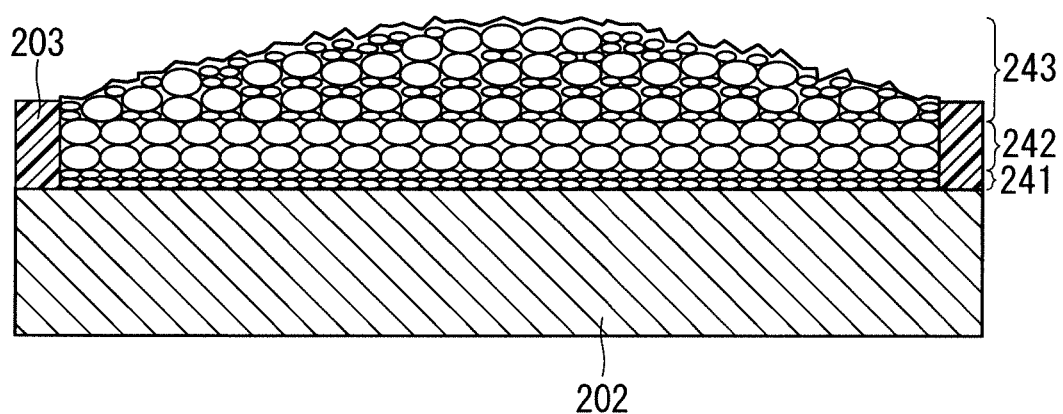
FIG. 18 A diagram schematically illustrating the surface state of a cold spray film.

Here, FIG. 18 schematically illustrates the film structure of the cold spray film 208. As illustrated in FIG. 18, the cold spray film 208 has a multilayer structure including a cold spray film 241 formed of fine particles in the vicinity of the surface side of the Al alloy electrode 202, a cold spray film 242 formed of large particles on the cold spray film 241, and a cold spray film 243 formed of large particles and fine particles on the cold spray film 242.

From FIG. 18, it is understood that the number (density) of vacancies (gap between particles) in the central part in the film thickness direction of the cold spray film 208 is larger than the number (density) of vacancies in the region close to the Al alloy electrode 202, and the number (density) of vacancies near the outermost surface. Here, when the film thickness of the cold spray film 208 is, for example, 60 μm, the region in the vicinity of the outermost surface in the film thickness direction of the cold spray film 208 is a region 15 to 20 μm from the outermost surface, the region close to the Al alloy electrode 202 is a region 6 to 13 μm from the Al alloy electrode 202, and the central part is a region between the above two regions and has a thickness of 27 to 39 μm.

Note that FIG. 18 illustrates the particles in a shape in which the sphere is flattened for the sake of convenience, and the particle diameter is enlarged, and the ratio to the protective film 203 is not accurate. The actual outermost surface of the cold spray film 208 is not irregular with flattened particles, but is in a state where minute irregularities are continuous.

By adopting such a film structure, the bondability between the Al alloy electrode 202 and the cold spray film 208 is improved, and the bondability between the cold spray film 208 and the Cu wire is also improved.

Also, particles having a large particle diameter cannot obtain sufficient kinetic energy to form a cold spray film when discharged from a nozzle of the cold spray equipment described later. Even if the particles collide with the previously formed cold spray film, the particles do not bond each other and are repelled outside the film by the flow of the discharge gas.

Here, although, the thickness of the Al alloy electrode 202 is 5 μm, it may be thinner than 5 μm, and conversely it may be thicker than 5 μm, as long as at least damage on the semiconductor device caused by the formation of the cold spray film is prevented. Further, an Ni plating film may be formed on the Al alloy electrode 202 by a wet plating method, or an Ni sputtered film may be formed by vacuum deposition.

Although, Cu powder is used as the metal powder to be supplied to the cold spray equipment in Embodiment 1, any metal that can form a metal bond with the surface to be bonded, and may include Cu alloy powder, Al powder, Ni powder or Sn powder, or a powder in which these are mixed. The thickness of the cold spray film 208 can be controlled by the spray irradiation time, irradiation speed (gas pressure), and irradiation temperature. In Embodiment 1, when bonding the Cu wire, the thickness of the cold spray film 208 is sufficient to have a thickness enough to protect the device structure under the cold spray film 208, and 30 μm is taken as an example. However, if the damage of the semiconductor device by bonding with Cu wire can be protected, it is sufficient to have a thickness of about 10 μm.

In addition, if the cold spray film 208 becomes excessively thick, the semiconductor wafer on which the semiconductor device is formed is warped and cracked; therefore, the thickness of 100 μm or less is desirable. In addition, the outermost surface of the formed cold spray film 208 is not smooth but uneven and irregularity is present. For example, while a Cu film formed by wet plating has a crystal size of about 5 μm, a cold spray film is mainly formed of particles of about 20 μm. Therefore, the outermost surface of the cold spray film 208 is not smoother than the Cu film formed by wet plating, and is uneven and irregularity is present. As for the irregularity, for example, the arithmetic average Ra derived from the line roughness measured in the range of 100 μm×100 μm with a laser microscope is desirably 1 μm or more and 10 μm or less. The size of the irregularity here is measured by a non-contact type white interferometer.

Thus, uneven irregularity present on the outermost surface of the cold spray film 208. Therefore, the convex portion is deformed first by the load when bonding the Cu wire thereon and the damage to the semiconductor device due to the bonding load is absorbed. Further, the Cu wire fits into the recesses, so that the surface area of the bonding increases, and the bonding quality of the bonding of the Cu wire is improved.

The particle size in the cold spray film is, for example, a value measured by observing a cross section of the cold spray film and using an electron backscatter diffraction patterns (EBSD).

Even when particles having 30 μm or more in diameter are contained in the powder discharged from the nozzle of the cold spray equipment, the particles are deformed at the time of collision with the semiconductor device; therefore, when the cold spray film 208 having a film thickness of 30 μm is formed, it is not necessarily that the powder contains particles having 30 μm or less in particle diameter.

In Embodiment 1, a SiC semiconductor device is mounted on the insulating substrate 103, and the sealing material 105 is an epoxy material. Due to the difference in coefficient of linear expansion and elastic modulus between SiC and sealing resin, an edge of the semiconductor device at the interface between the semiconductor device and the sealing material 105 possibly peels due to thermal stress caused by heat generation during operation of the semiconductor device. However, due to the irregularity of the outermost surface of the cold spray film 208, when the sealing material 105 is introduced into the case 102, the sealing resin engages with the irregularity of the cold spray film 208; therefore, an effect is exhibited in which peeling of the edge of the semiconductor device may hardly occur due to the anchor effect.

Normally, in a case where a metal film such as Cu is formed, when the sputter deposition method is employed, the film thickness is 2 to 3 μm of which film thickness distribution is in nanometer order, and is flat. Or, in a case where the metal film is formed by plating, the metal film has a thickness of several μm to 30 μm of which film thickness distribution is in submicron order, and is flat.

Meanwhile, as will be described later, in Embodiment 1, the metal film is formed using a mask by the cold spray method, the film thickness in the vicinity of the protective film 203 is thinner than the thickness of the central part of the cold spray film 208. By setting the difference in thickness to 1 μm or more and 10 μm or less, while securing the thickness of the central part where the Cu wire is bonded, due to the thickness distribution from the central part, the surface area of the cold spray film 208, that is, the area of irregularity increases; therefore, the sealing resin hardly peels off. Accordingly, the cold spray film 208 has a film thickness distribution in which the thickness decreases from the central part toward the edge part, and the surface of the cold spray film 208 has film morphology with irregularities of 1 μm or more to 10 μm or less. Here, the film thickness of the central part of the cold spray film 208 means an average value of the measured values in the range of 1 mm×1 mm of the central part, and the film thickness in the vicinity of the protective film 203 means an average value of measured values in the range of 50 μm from the protective film 203. Here, in FIG. 14, the average value of the measured cold spray film 208 is shown by a solid line 231 and the difference between the film thickness of the central part and the film thickness in the vicinity of the protective film 203 is shown as the film thickness difference 232.

In addition, if the thickness difference 232 of the cold spray film 208 is 10 μm or more, the film thickness at the center part is excessively thick, the internal stress in the film at the center part increases, this may lead to malfunction inside the cold spray film 208. However, if it is less than 1 μm, the cold spray film 208 becomes nearly flat, and the effect of suppressing peeling off of the sealing resin is reduced. Therefore, the irregularity of the surface of the cold spray film 208 is desirably 1 μm or more and 10 μm or less. FIG. 14 schematically illustrates the irregularities of the surface of the cold spray film 208, and illustrates the height 233 of the protrusion as an example. When the thickness difference 232 of the cold spray film 208 is about 10 μm, the height 233 of the projection in irregularity on the surface of the cold spray film 208 is about 1 μm or less.

Here, the thickness of the cold spray film 208 can be measured by an ultrasonic inspection method. That is, the thickness is measured with a difference between the time required for the ultrasonic wave emitted from the ultrasonic probe to the semiconductor device after film formation to pass through the Cu film and the time until the ultrasonic wave reflects at the interface with the Al alloy electrode 202 and returns.

In the bonding of the Cu wire, the protective film 203 is likely to be damaged by the bonding portion being crushed and expanded from the original wire diameter, and the expanded portion coming into contact with the protective film 203. Therefore, bonding is desirably performed such that the center of bonding is at the position away from the protective film 203 by 100 μm or more. As a result, bonding is performed at a position where the cold spray film 208 is thick; therefore, the effect of suppressing the occurrence of malfunction in the semiconductor device due to the load and ultrasonic vibration during bonding is enhanced.

<Manufacturing Method>

Next, a method for manufacturing the semiconductor device according to Embodiment 1 will be described with reference to FIGS. 5 to 9. In the following description, a method of manufacturing the freewheeling diode 104*b* will be described for simplification.

Figure 5:
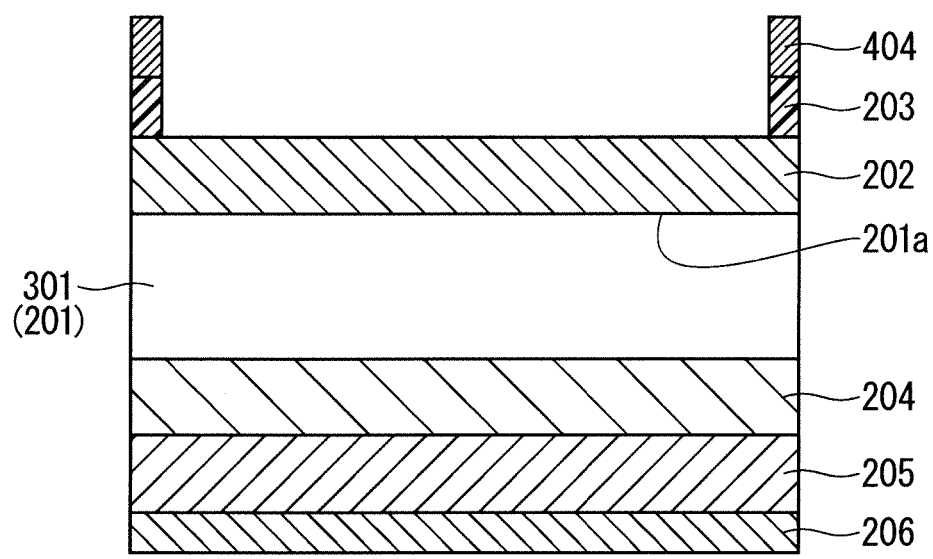
FIG. 5 A cross-sectional view illustrating a manufacturing process of the semiconductor device of Embodiment 1 according to the present invention.

As illustrated in FIG. 5, an Al alloy electrode 202, which is the first main electrode 210, is formed on the first main surface 201*a* of the semiconductor substrate 201 provided with a diffusion layer (not shown). The Al alloy electrode 202 is formed by vacuum deposition such as physical vapor deposition (PVD) or chemical vapor deposition (CVD). Thereafter, the semiconductor substrate 201 is ground from the second main surface 201*b* side to have a predetermined thickness.

Next, the barrier metal 204, the Ni electrode 205, and the Au electrode 206 are formed in this order on the second main surface 201*b* after grinding to form the second main electrode 220, for example, by vacuum deposition.

Next, the protective film 203 having a thickness of 2 to 10 μm is formed on the Al alloy electrode 202 by applying photosensitive polyimide (PI) and selectively exposing the protective film 203, and if the protective film 203 is made of an organic material, the film is formed after the Ni electrode 205 and the Au electrode 206 are formed. Thereafter, a mask 404 for cold spraying is overlaid on the protective film 203.

Figure 6:
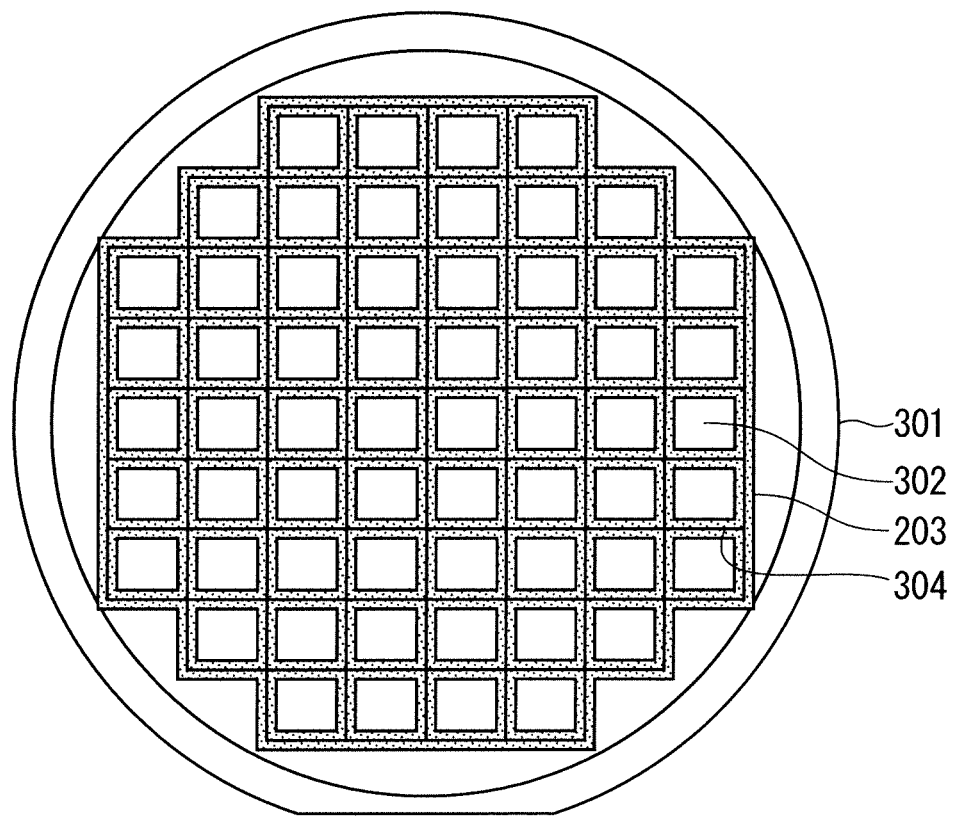
FIG. 6 A plan view illustrating a semiconductor wafer at a stage where a protective film is formed.

FIG. 6 is a plan view of a semiconductor wafer 301 at the stage where the protective film 203 is formed as viewed from the upper surface side. As illustrated in FIG. 6, the protective film 203 is provided along the dicing line 304 in a rectangular semiconductor device formation region 302 enclosed by the dicing line 304. The protective film 203 is not formed on the dicing line 304.

Figure 7:
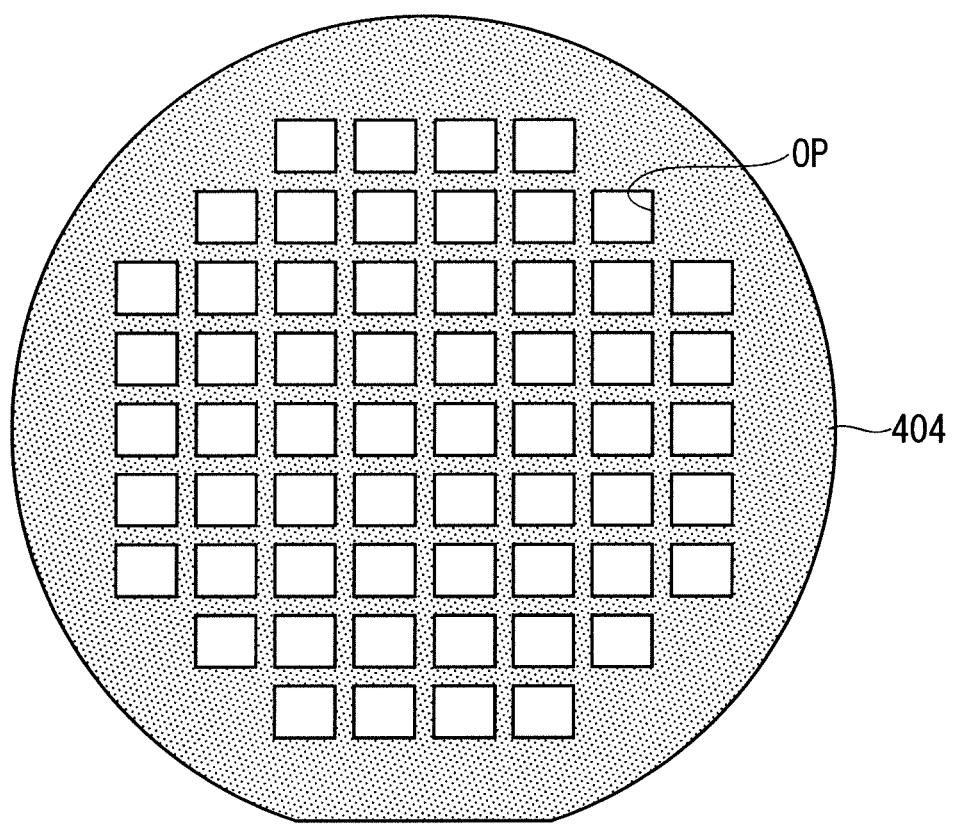
FIG. 7 A plan view illustrating a state in which a mask is overlaid on a protective film.

FIG. 7 is a plan view illustrating a state in which the mask 404 is overlaid on the protective film 203. The mask 404 covers the protective film 203 and the dicing line 304, and a portion where a cold spray film is formed in the semiconductor device formation region 302 is an opening OP. The material of the mask 404 is, for example, a stainless steel (SUS) plate, and has a thickness that prevents the powder discharged by the cold spray equipment from penetrating the mask, for example, 0.5 to 5 mm, preferably about 1 mm. Note that the SUS plate may be configured such that the portion facing the protective film 203 is coated with the same type of organic substance as the protective film 203. Accordingly, the protective film 203 and the SUS plate are directly in contact with each other; thereby, possible damaged of the protective film 203 can be reduced.

FIG. 8 illustrates a state in which the cold spray equipment 420 is arranged on the upper part of the semiconductor wafer 301 on which the mask 404 is overlaid, and the powder 423 is discharged from the tip of the nozzle 422 of the cold spray equipment 420 toward the Al alloy electrode 202 which is the surface to be bonded. By discharging the powder 423, a cold spray film 208 is formed on the Al alloy electrode 202. Note that the powder 423 is metal powder having a particle that is 100 μm or less in diameter, and in Embodiment 1, Cu powder is used as a material that can be wedge-bonded with a Cu wire that is a wiring material. The powder 423 may be metal powder such as Ni, Ag, Pd, or Au. In addition, when the wiring material is bonded with the solder material based on Sn instead of being wedge-bonded with the Cu wire, any material that can be soldered may be used, and solder powder based on Sn may also be used.

Here, an outline of the cold spray equipment 420 will be described. As illustrated in FIG. 8, via a pipe 424 provided on the side opposite to the nozzle 422 of the spray gun 421 having the nozzle 422 for discharging the powder 423, the cold spray equipment 420 is connected to a powder supply device (not shown) and a high pressure gas generator (not shown). The powder 423 supplied from the powder supply device to the pipe 424 is heated to a high temperature when passing through the spray gun 421 to which a heater (not shown) is attached. The high pressure gas is supplied from the high pressure gas generator to the pipe 424, and the powder 423 heated to a high temperature is energized and discharged from the nozzle 422 at the tip of the spray gun 421 onto the Al alloy electrode 402 which is the surface to be bonded.

The high pressure gas may be an inert gas, for example, nitrogen gas, but argon or helium gas may be used as well. In addition, when the pressure of the high pressure gas is discharged from the tip of the nozzle 422, for example, the pressure is such that the injection pressure is 0.1 to 10 MPa, the powder supply rate is 1 to 100 g/min at a flow rate of 1 to 1000 ml min. By spraying the powder 423 under such conditions, it is possible to form a cold spray film 208 having an arbitrary film thickness for an arbitrary discharge time.

Also, by setting the pressure as above, as described above, a collision can preferentially be started from finer particles having a light weight to the Al alloy electrode 202 to form a cold spray film, thereafter, the particles that are heavier and having a larger diameter collide with the previously formed cold spray film.

The heater temperature is adjustable in the range of 150 to 700° C., and is arbitrarily selected depending on the material to be discharged.

Although the distance between the tip of the nozzle 422 and the mask 404 is set to about 5 mm, the cold spray film 208 can be formed if the distance is between 1 mm and 300 mm. As described above, this distance is a distance for eliminating particles having a large particle diameter. When a particle having a large particle diameter is discharged from the nozzle of the cold spray equipment, the particle having a particle diameter that is too large to obtain kinetic energy sufficient to form a cold spray film is to be removed out of the film by the flow of discharge gas between the tip of the nozzle 422 and the mask 404.

After forming the cold spray film 208, the mask 404 is removed, and the powder that has not contributed to the film formation is removed from the semiconductor wafer 301 with a blower. Thereafter, the powder that has not contributed to the film formation is removed by ultrasonic cleaning in liquid having reducibility so as not to oxidize the formed cold spray film 208 or in acidic liquid that dissolve Cu slightly. Alternatively, the oxide film formed on the outermost surface of the cold spray film 208 may be removed, and then a rust preventive film such as benzotriazole may be formed to prevent oxidation.

Furthermore, the semiconductor wafer 301 is dried under an inert gas atmosphere such as nitrogen gas, and a denser metal film is formed, in the cold spray film 208, by relaxing the residual stress generated when the powder 423 collides and recrystallizing the bonding interface between the particles.

Figure 9:
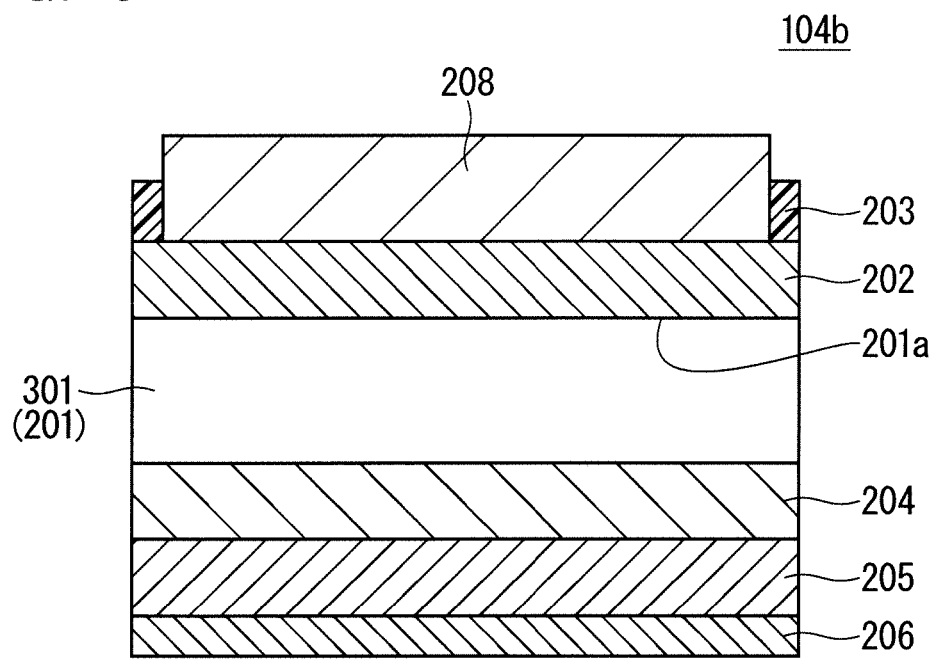
FIG. 9 A cross-sectional view illustrating the manufacturing process of the semiconductor device of Embodiment 1 according to the present invention.

The semiconductor wafer 301 on which the cold spray film 208 is formed is diced by a dicing device along a dicing line, and is singulated into freewheeling diodes 104b as illustrated in FIG. 9.

Note that drying and recrystallization under the nitrogen gas may be performed not before the dicing process but in the process after dicing. For example, it is efficient to perform the process during the assembly process of the module 100. It is efficient to dry using reflow heat at the time of chip die bonding.

Embodiment 2

In Embodiment 1 described above, the configuration in which the cold spray film 208 is formed on the surface electrode of the semiconductor device 104 has been described. In Embodiment 2, a method of manufacturing a semiconductor device in which a cold spray film is formed on a back electrode will be described with reference to FIGS. 10 to 12. It should be noted that, in FIGS. 10 to 12, the same components as those of Embodiment 1 described with reference to FIGS. 5 to 9 are denoted by the same reference numerals, and overlapping descriptions are omitted. In the following description, a method of manufacturing the freewheeling diode 104b will be described for simplification.

Figure 10:
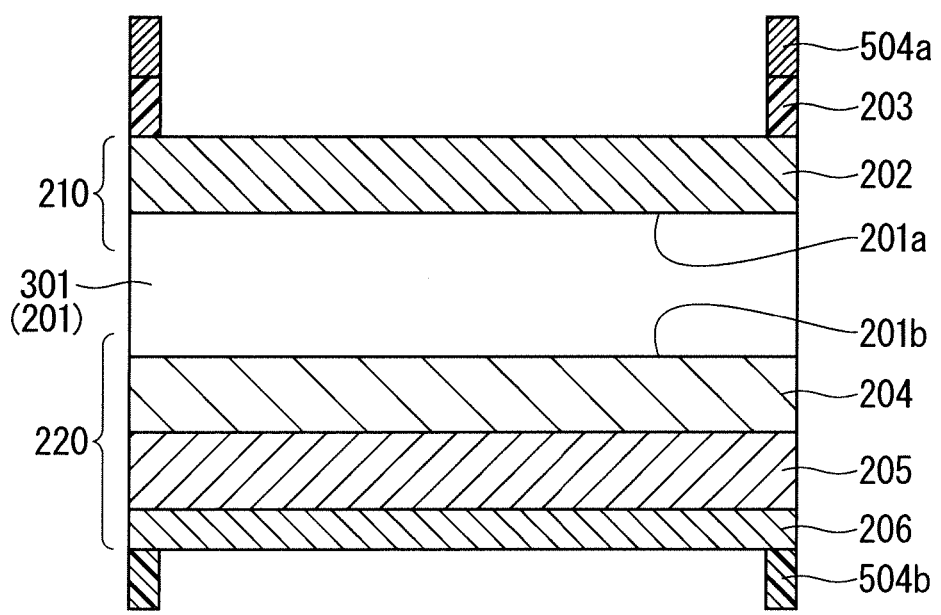
FIG. 10 A cross-sectional view illustrating a manufacturing process of a semiconductor device of Embodiment 2 according to the present invention.

As illustrated in FIG. 10, an Al alloy electrode 202 as a first main electrode 210 is formed on a first main surface 201a of a semiconductor substrate 201 provided with a diffusion layer (not shown). Thereafter, the semiconductor substrate 201 is ground from the second main surface 201b side to have a predetermined thickness.

Next, the barrier metal 204, the Ni electrode 205, and the Au electrode 206 are formed in this order on the second main surface 201b after grinding to form the second main electrode 220.

Next, the protective film 203 is formed on the Al alloy electrode 202, and if the protective film 203 is made of an organic material, the film is formed after the Ni electrode 205 and the Au electrode 206 are formed. Thereafter, a mask 504a for cold spraying is overlaid on the protective film 203.

The shape of the protective film 203 in plan view is the same as the protective film 203 described with reference to FIG. 6, and is provided along the dicing line 304 and is not formed on the dicing line 304.

Further, the shape of the mask 504a in plan view is the same as the mask 404 described with reference to FIG. 7, and the portion where the cold spray film is formed in the semiconductor device formation region 302 is an opening OP, and covers the dicing line 304. The material of the mask 504a is the same as that of the mask 404.

Further, a mask 504b for cold spraying is overlaid on the Au electrode 206. The shape of the mask 504b in plan view is the same as the mask 404 described with reference to FIG. 7, and the portion where the cold spray film is formed in the semiconductor device formation region 302 is an opening OP, and covers the dicing line 304. The material of the mask 504b is also the same as that of the mask 404.

As described above, the semiconductor wafer 301 is sandwiched between the masks 504a and 504b from the front surface side and the back surface side, respectively, and the periphery of the semiconductor wafer 301 is mechanically fixed. Therefore, cold spray films are formed simultaneously at corresponding positions under the same conditions.

Figure 11:
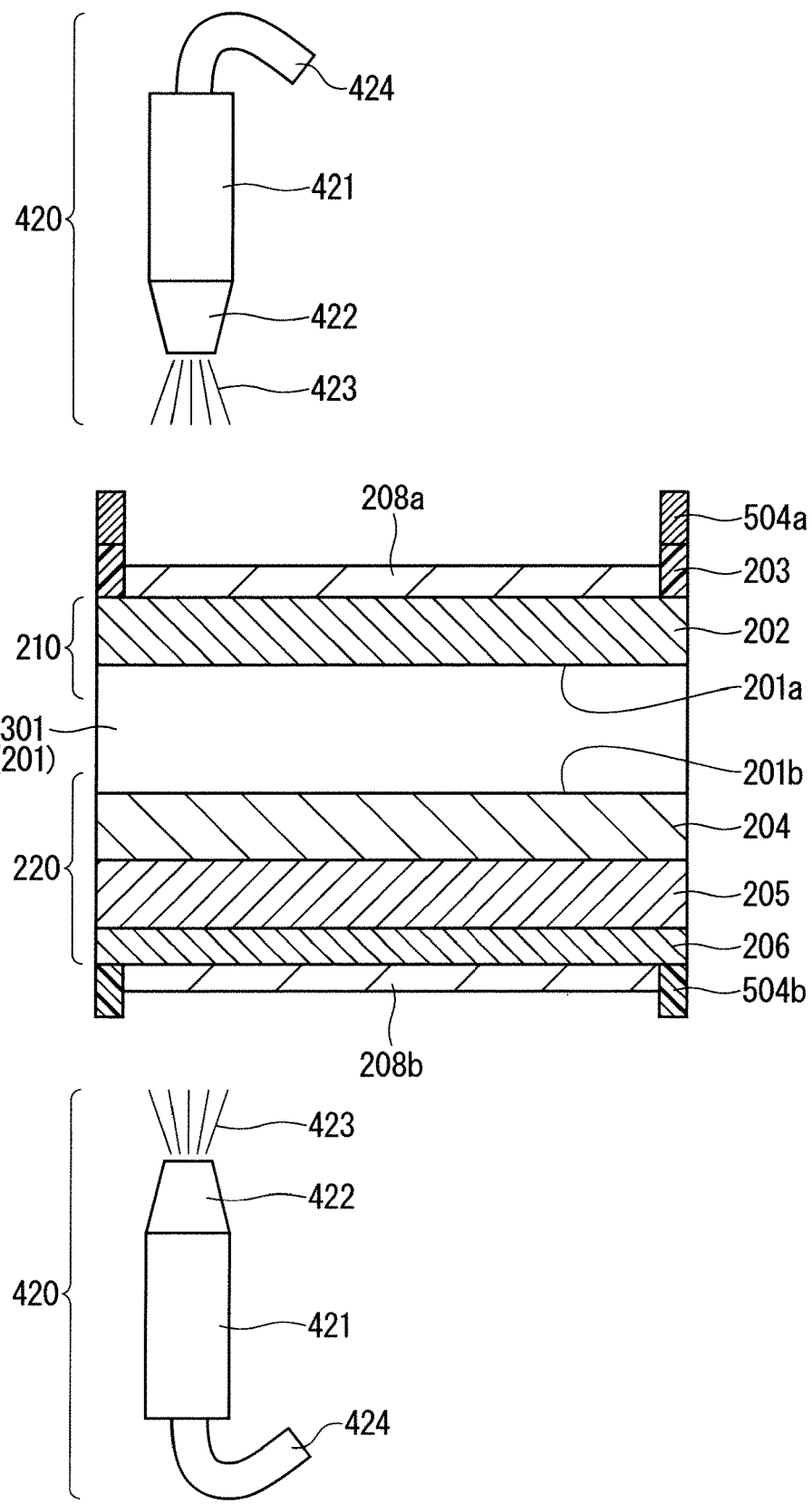
FIG. 11 A cross-sectional view illustrating the manufacturing process of the semiconductor device of Embodiment 2 according to the present invention.

FIG. 11 illustrates a state in which the cold spray equipment 420 are arranged on the upper surface and the back surface of the semiconductor wafer 301 on which masks 504a and 504b are overlapped, respectively, and the powder 423 is being discharged from the tip of the nozzle 422 of each the cold spray equipment 420 toward the Al alloy electrode 202 and the Au electrode 206 that are the surfaces to be bonded. By discharging the powder 423, a cold spray film 208a (first cold spray film) and a cold spray film 208b (second cold spray film) are formed on the Al alloy electrode 202 and the Au electrode 206, respectively. Note that the cold spray film 208a may be referred to as a first metal film and the cold spray film 208b may be referred to as a second metal film.

Note that the powder 423 is metal powder having a particle that is 100 μm or less in diameter, and in Embodiment 1, Cu powder is used as a material that can be wedge-bonded with a Cu wire that is a wiring material.

The powder 423 may be metal powder such as Ni, Ag, Pd, or Au. In addition, when the wiring material is bonded with the solder material based on Sn instead of being wedge-bonded with the Cu wire, any material that can be soldered may be used, and solder powder based on Sn may also be used.

If the cold spray film 208b on the back surface side is not bonded to a Cu wire, the metal may be any metal material that has good reactivity with Ni. Further, it does not need to be Cu if the material has excellent solder adhesion, for example, and any metal material such as Ni, Au, Ag, Pd, Sn may be used as long as it has a good reactivity with solder based on Sn. Or, when the semiconductor device 104 is bonded to a conductor pattern on an insulating substrate 103 by Ag sintering, for the metal of the cold spray film 208b, Au, Ag, Pd, or the like having good reactivity with Ag, may be used.

Further, the cold spray films 208a and 208b are desirably made of the same metal material and have the same thickness. By adopting such a configuration, the effect of suppressing the warpage of the semiconductor wafer 301 is enhanced, and the semiconductor wafer 301 can be prevented from cracking during manufacturing.

Here, the same film thickness means that the average value (average film thickness) measured in the range of 1 mm×1 mm in the central part of each of the cold spray films 208a and 208b is the same. And as described earlier with reference to FIG. 14, the film thickness difference 232 between the film thickness in the central part and the film thickness in the vicinity of the protective film 203 is 10 μm or less, and the outermost surface of the cold spray film 208 has irregularities of about 1 μm; therefore, if the difference between the average values of the film thickness of 208a and 208b is 10 μm or less, the film thickness is deemed to be the same.

Note that the configuration of the cold spray equipment 420 has been described in Embodiment 1, and the description thereof is omitted.

As described above, by forming the cold spray films 208a and 208b having the same film thickness on the front surface side and the back surface side of the semiconductor wafer 301, the semiconductor wafer 301 is prevented from warping to either one surface side.

After forming the cold spray films 208a and 208b, the masks 504a and 504b are removed, and the powder that has not contributed to the film formation is removed from the semiconductor wafer 301 with a blower. Thereafter, the powder that has not contributed to the film formation is removed by ultrasonic cleaning in liquid having reducibility so as not to oxidize the formed cold spray films 208a and 208b or in acidic liquid that dissolve Cu slightly. Alternatively, the oxide film formed on the outermost surface of the cold spray films 208a and 208b may be removed, and then a rust preventive film such as benzotriazole may be formed to prevent oxidation.

Figure 12:
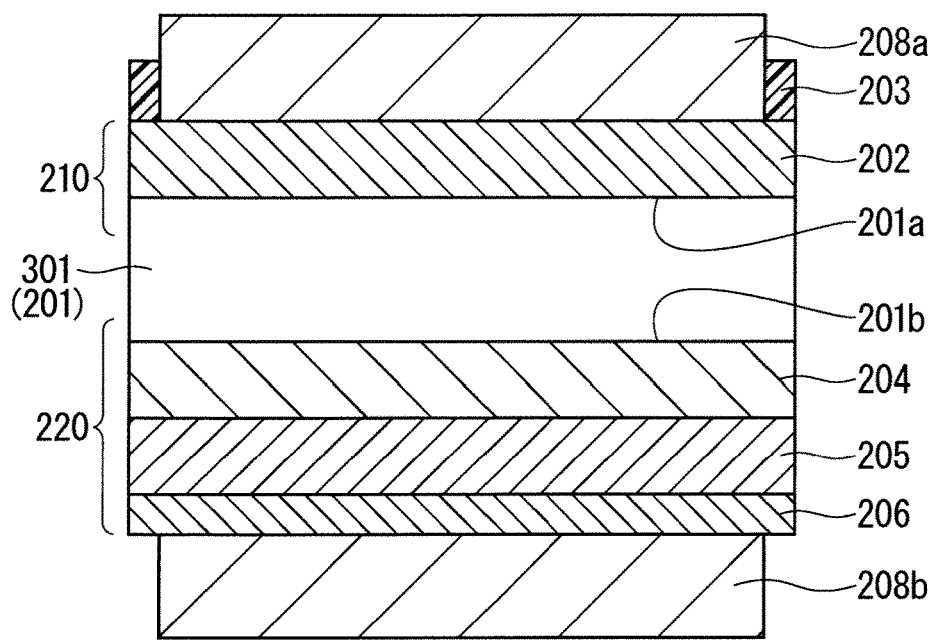
FIG. 12 A cross-sectional view illustrating the semiconductor device of Embodiment 2 according to the present invention.

The semiconductor wafer 301 on which the cold spray films 208a and 208b are formed is diced by a dicing apparatus along the dicing line, and is singulated into freewheeling diodes 104b as illustrated in FIG. 12.

The freewheeling diode 104b formed in this manner has cold spray films 208a and 208b on the front surface side and the back surface side, respectively, so that Cu wires can be bonded to either surface. In addition, although the surface where the Cu wire is not bonded is bonded to the conductor pattern on the insulating substrate 103 by solder, the reliability of the bonded portion is greatly improved by having a cold spray film.

In the manufacturing method described above, the dicing line 304 is covered with the mask 504b; therefore, in the freewheeling diode 104b illustrated in FIG. 12, the position of the end surface of the cold spray film 208b is at a predetermined distance from the end surface of the semiconductor substrate 201, corresponding to the dicing line. However, when the cold spray film 208b formed on the back surface side can be sufficiently cut in the dicing process, the cold spray mask 504b on the back surface side is not necessarily required, and the cold spray film 208b may be formed on the entire back surface of the semiconductor wafer 301.

Figure 13:
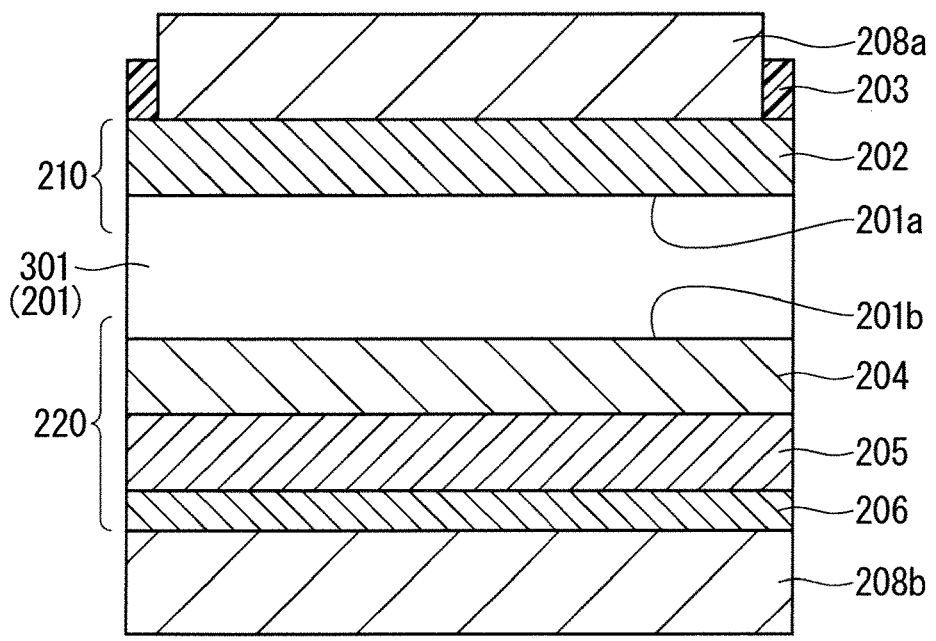
FIG. 13 A cross-sectional view illustrating the semiconductor device of a modification of Embodiment 2 according to the present invention.

In this case, as illustrated in FIG. 13, the cold spray film 208b is formed on the entire back surface of the freewheeling diode 104b. Note that, in Embodiment 2, a method in which the cold spray films are simultaneously formed on the front surface side and the back surface side of the semiconductor wafer has been described. However, film formation may be performed on one surface at a time, and the film forming order is not particularly limited. Further, the film thickness is not necessarily the same.

<Modification>

In Embodiment 2 described above, although the cold spray film 208b is formed on the Au electrode 206, a configuration in which a film is formed on the Ni electrode 205 without providing the Au electrode 206 may be used. In this case, it is not necessary to use expensive Au, the semiconductor device can be manufactured at low cost.

When the cold spray film 208b is formed on the Ni electrode 205, the thermal energy and kinetic energy of the metal powder discharged from the cold spray equipment collide with the Ni electrode 205 which is the surface to be bonded. The frictional heat (energy) generated by the collision causes deformation on each of the outermost surfaces of the metal powder and the Ni electrode 205, and they are entangled with each other. The cold spray film 208 is formed by removing the respective outermost metal oxide films, continuously discharging metal powder from the cold spray equipment on a film formed by the reaction occurring at the interface between the metal powder and the Ni electrode 205, and continuously colliding with the previously formed cold spray film, and the film thickness is increased, thereby the cold spray film 208b is finally obtained.

Here, the cold spray film 208b formed on the Ni electrode 205 and the cold spray film 208a formed on the Al alloy electrode 202 both have the same particle size distribution, however, if the cold spray film 208b on the back surface side is not bonded to a Cu wire, the metal may be any metal material as long as it has good reactivity with Ni, and further, it does not need to be Cu if the material has excellent solder adhesion, for example, and any metal material such as Ni, Au, Ag, Pd, Sn may be used as long as it has a good reactivity with solder based on Sn. Or, when the semiconductor device 104 is bonded to a conductor pattern on an insulating substrate 103 by Ag sintering, for the metal of the cold spray film 208b, Au, Ag, Pd, or the like having good reactivity with Ag, may be used.

Embodiment 3

Figure 16:
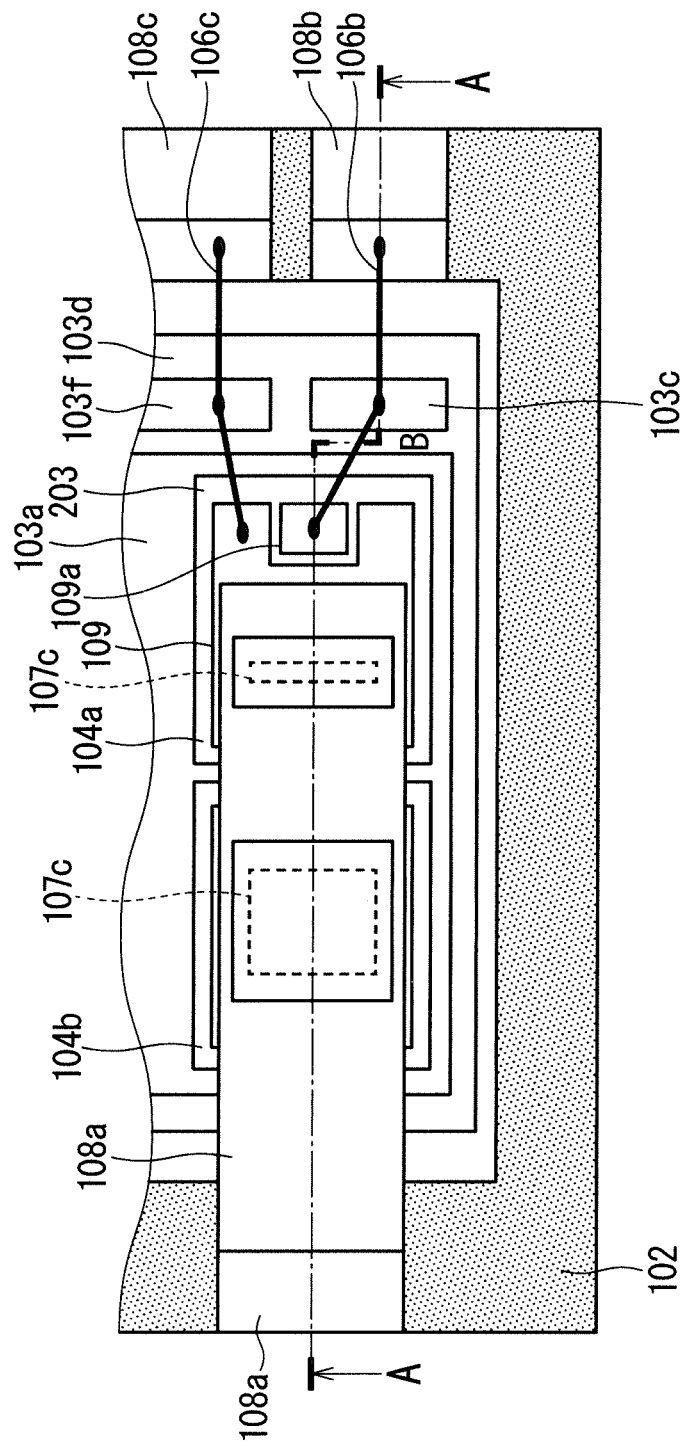
FIG. 16 A plan view illustrating the semiconductor device module on which the semiconductor device of Embodiment 3 according to the present invention is mounted.

FIG. 15 is a cross-sectional view illustrating a semiconductor device module (hereinafter referred to as module) 300 on which a semiconductor device of Embodiment 3 according to the present invention is mounted. FIG. 16 is a partial plan view of a module 300 as viewed from above, and a cover, a sealing resin, and the like for closing an opening are omitted. Note that the cross section in the direction of the arrow along the line A-B-A in a drawing is the cross section in FIG. 15. It should be noted that, in FIGS. 15 and 16, the same components as those of the module 100 described with reference to FIGS. 1 and 2 are denoted by the same reference numerals, and overlapping descriptions are omitted.

As illustrated in FIG. 15, the module 300 is different from the module 100 of Embodiment 1 in that the main wiring of the upper portion of the semiconductor device 104 is configured by a plate wiring 108a made from a Cu plate instead of a Cu wire.

That is, the plate wiring 108a is a part of a terminal installed in the case 102, and one end part thereof also functions as a terminal, so that it is referred to as a plate terminal 108a. By using the plate wiring 108a, the contact area with the upper surface electrode 109 of the semiconductor device 104 can be increased, and the contact resistance can be reduced.

The plate wiring 108a connects the upper surface electrode 109 of the switching device 104a and the upper surface electrode 109 of the free wheel diode 104b with terminal bonding solder 107c (sometimes called solder 107c); thereby bonding the both devices. The plate wiring 108a has openings OP at a position corresponding to the upper surface electrode 109 of the switching device 104a and at a position corresponding to the upper surface electrode 109 of the freewheeling diode 104b, and the opening OP is filled with the solder 107c; therefore, each upper surface electrode 109 and the plate wiring 108a are electrically connected. Note that the solder 107c may be a solder material having a composition different from that of the under-chip solder 107a, and instead of the solder, an adhesive containing Ag or an Ag sintered material may be used to bond the plate terminal 108a and the upper surface electrode 109. A protective film 203 is provided on the edge part of each upper surface electrode 109.

The gate electrode 109a of the switching device 104a is connected to the upper conductor pattern 103c via the gate wiring 106b, and the gate wiring 106b is also connected to a signal terminal 108b. The upper surface electrode 109 of the switching device 104a is connected to the upper conductor pattern 103f via a signal detection wiring 106c, and the signal detection wiring 106c is also connected to a signal terminal 108c.

The plate wiring 108a only needs to have electrical conductivity that allows current to flow, and may be a plate material having a thermal expansion coefficient smaller than that of Cu. A plate material having a Cu-Invar-Cu multilayer structure in which front and back surfaces of Invar which is Fe—Ni alloy are plated with Cu may be used.

Further, although the plate wiring 108a is integrated with the main terminal 108a, the main terminal and the plate wiring may be provided separately, and be bonded together to have an integrated structure, by a bonding method such as welding, soldering, or ultrasonic bonding.

Further, as illustrated in FIG. 1, an upper conductor pattern 103b electrically connected to the source electrode is provided, the upper conductor pattern 103b and the plate wiring 108a is bonded by solder, and the upper conductor pattern 103b and the terminal 108 may be connected by wiring 106 as illustrated in FIG. 1, or may be connected by plate wiring.

Figure 17:
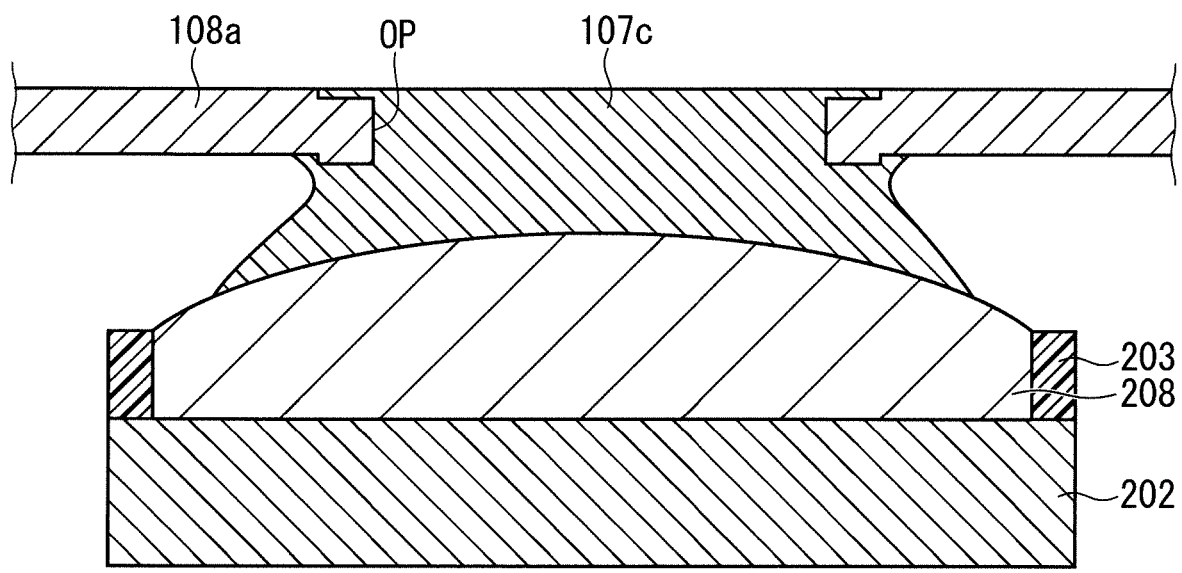
FIG. 17 A partial cross-sectional view illustrating the semiconductor device module on which the semiconductor device of Embodiment 3 according to the present invention is mounted.

FIG. 17 illustrates a partially enlarged view of a region A enclosed by a broken line in the module 300 of FIG. 15. As illustrated in FIG. 17, the inductance can be reduced as the wiring path length is shorter; therefore, it is desirable that the distance between the plate wiring 108a and the protective film 203 is as short as it can be. Meanwhile, the distance between the plate wiring 108a and the protective film 203 is preferably 300 μm or more in order to relax the electric field strength concentrated on the upper part of the protective film 203. In Embodiment 3, the distance between the protective film 203 and the plate terminal 108a is set in the range of 300 μm to 700 μm.

The semiconductor device 104 generates heat during operation, and the temperature is distributed so that the temperature of the center part of the semiconductor device 104 becomes high and the temperature decreases concentrically outwards. As described with reference to FIG. 14, the cold spray film 208 has a larger thickness at the center part than at the end part; therefore, the cold spray film 208 has the capacity of efficiently dissipating heat in a path in which the heat is dissipated from the top of the semiconductor device 104 via the plate terminal 108a.

In addition, by forming a cold spray film 208 made of Cu material, which excels the solder material in thermal conductivity, an effect is exhibited in that efficient heat dissipation from the upper part of the thick film portion of the cold spray film 208 is ensured.

Further, the surface of the cold spray film 208 has irregularities on the surface as described in Embodiment 1 with reference to FIG. 14 accordingly, the bonding area with the solder material increases compared to the case where the surface is smooth; therefore, the bonding strength improves.

The heat generated by the operation of the semiconductor device 104 causes a stress generated in the shear direction due to the difference in coefficients of linear expansion of various materials of the semiconductor device 104, the cold spray film 208, the terminal bonding solder 107c and the plate terminal 108a, and this proceeds deterioration from the bonding interface with the semiconductor device 104 having a small coefficient of linear expansion with respect to expansion and contraction of terminal bonding solder 107c having a larger coefficient of linear expansion.

Each coefficient of linear expansion of the semiconductor device 104, the cold spray film 208, the terminal bonding solder 107c, and the plate terminal 108a are $4.2 \times 10^{-6}$/K, $16.8 \times 10^{-6}$/K, 20 to $25 \times 10^{-6}$/K, and $16.8 \times 10^{-6}$/K, respectively.

The coefficient of linear expansion of the terminal bonding solder 107c differs depending on the composition thereof. The cold spray film 208 of Cu is present between the semiconductor device 104 and the terminal bonding solder 107c; therefore, the cold spray film 208 serves as a stress buffer layer to reduce the stress generated in the terminal bonding solder 107c. Further, the cold spray film 208 has a feature that the film thickness at the center part is thicker than that at the end part, and the nominal coefficient of linear expansion of the terminal bonding solder 107c can be reduced.

As described with reference to FIG. 18, the cold spray film 208 has a feature in that the number of holes (density) at the center portion in the film thickness direction is greater than the number of holes in a region near the Al alloy electrode 202, and the number is greater than the number of holes near the outermost surface. For this reason, such an effect in that the stress generated by the repeated heat generation during the operation of the semiconductor device 104 can be reduced in a region having many holes at the central portion of the cold spray film 208 can be obtained.

While the invention has been described in detail, the forgoing description is in all aspects illustrative and not restrictive. It is understood that numerous other modifications and variations can be devised without departing from the scope of the invention.

It should be noted that Embodiments of the present invention can be arbitrarily combined and can be appropriately modified or omitted without departing from the scope of the invention.

The invention claimed is:

1. A semiconductor device comprising:
   a first main electrode and a second main electrode respectively disposed on a first main surface and a second main surface of a semiconductor substrate;
   a protective film disposed on an edge part of the first main electrode; and
   a first metal film disposed in a region enclosed by the protective film on the first main electrode, wherein
   the first metal film is a cold spray film having a film thickness at a central portion larger than that at a part in contact with the protective film, and has irregularities on a surface thereof.

2. The semiconductor device according to claim 1, wherein
   a difference between the film thickness at the central portion of the first metal film and the film thickness at the part in contact with the protective film is between 1 μm or more and 10 μm or less.

3. The semiconductor device according to claim 1, wherein
   the irregularities are irregularities of 1 μm or less.

4. The semiconductor device according to claim 1, wherein
   the first metal film has a film structure in which powder particle spacing is denser closer to the first main electrode, the powder particle spacing is wider further from the first main electrode, and the powder particle spacing is denser closer to an outermost surface.

5. The semiconductor device according to claim 1, further comprising
   a second metal film disposed on the second main electrode, wherein
   The second metal film is made of a same metal material as the first metal film, and has a same average thickness.

6. The semiconductor device according claim 1, further comprising
   wiring connected to an upper portion of the first metal film, wherein
   the wiring is formed of a wire.

7. The semiconductor device according claim 1, further comprising
wiring connected to an upper portion of the first metal film, wherein
the wiring is formed of a plate material.

8. A manufacturing method of a semiconductor device including a first main electrode and a second main electrode respectively disposed on a first main surface and a second main surface of a semiconductor substrate, the method comprising the steps of:
(a) overlaying a mask such that a protection film selectively formed on the first main electrode is covered therewith; and
(b) forming a first cold spray film by depositing metal powder on the first main electrode via the mask by a cold spray equipment, wherein the first cold spray film has a film thickness at a central portion larger than that at a part in contact with the protective film, and has irregularities on a surface thereof.

9. The manufacturing method of the semiconductor device according to claim 8, wherein
the step (b) includes a step of simultaneously forming the first cold spray film and a second cold spray film by depositing metal powder on the second main electrode.

10. The manufacturing method of the semiconductor device according to claim 8, wherein
the step (b) includes a step of setting a pressure of the metal powder having a particle size distribution such that particles having a particle diameter that is equal to or smaller than that of particles forming a peak of the particle size distribution of the metal powder reach a surface to be bonded first, and then, particles having a particle diameter exceeding the particle diameter of the particles forming the peak reach the surface to be bonded.

11. The manufacturing method of the semiconductor device according to claim 10, wherein
the pressure is set in a range of 0.1 to 10 MPa.

12. The manufacturing method of the semiconductor device according to claim 10, wherein
the particle diameter of the particles forming the peak includes particles having diameters in a range of plus or minus 10% of 20 μm.

13. The manufacturing method of the semiconductor device according to claim 8, wherein
the step (b) includes a step of setting a position of a nozzle such that a distance between a tip of the nozzle that discharges the metal powder from the cold spray equipment and the mask is in a range of 1 mm to 300 mm.

14. The manufacturing method of the semiconductor device according to claim 9, wherein
the step (b) includes a step of forming the second cold spray film with a same metal material as the first cold spray film to have a same thickness.

15. The manufacturing method of the semiconductor device according to claim 8, wherein
the metal powder includes Cu or a Cu alloy.

* * * * *